United States Patent [19]

Bengston

[11] Patent Number: 5,147,692
[45] Date of Patent: Sep. 15, 1992

[54] ELECTROLESS PLATING OF NICKEL ONTO SURFACES SUCH AS COPPER OR FUSED TUNGSTON

[75] Inventor: Jon E. Bengston, Newington, Conn.

[73] Assignee: MacDermid, Incorporated, Waterbury, Conn.

[21] Appl. No.: 689,666

[22] Filed: Apr. 23, 1991

Related U.S. Application Data

[63] Continuation of Ser. No. 520,635, May 8, 1990, abandoned.

[51] Int. Cl.$^5$ ............................................. C23C 26/00
[52] U.S. Cl. ................................... 427/438; 427/437; 427/443.1; 427/304; 427/305; 427/306
[58] Field of Search .................. 427/437, 438, 443.1, 427/304, 305, 306

[56] References Cited

U.S. PATENT DOCUMENTS

| | | | |
|---|---|---|---|
| 2,606,566 | 8/1952 | Tarnopol | 427/437 |
| 2,762,723 | 9/1956 | Talmey | 427/438 |
| 3,011,920 | 12/1961 | Shipley | 106/1.11 |
| 3,532,518 | 10/1970 | D'Ottavio | 106/1.11 |
| 3,562,038 | 2/1971 | Shipley | 427/304 |
| 3,935,013 | 1/1976 | Lelental | 427/437 |
| 3,993,799 | 11/1976 | Feldstein | 427/305 |
| 4,059,710 | 11/1977 | Nishiyama | 427/438 |
| 4,136,216 | 1/1979 | Feldstein | 427/306 |
| 4,167,416 | 9/1979 | Zolla | 427/438 |
| 4,220,678 | 9/1980 | Feldstein | 427/305 |
| 4,239,813 | 12/1980 | Murakami | 427/306 |
| 4,276,323 | 6/1981 | Oka | 427/437 |
| 4,759,952 | 7/1988 | Brasch | 427/98 |
| 4,761,304 | 8/1988 | Brasch | 427/98 |
| 4,847,114 | 7/1989 | Brasch | 427/96 |
| 4,863,758 | 9/1989 | Rhodenizer | 427/97 |
| 5,079,040 | 1/1992 | Brandenburger | 427/305 |

FOREIGN PATENT DOCUMENTS 1254935   11/1967   Fed. Rep. of Germany ...... 427/438

Primary Examiner—Shrive Beck
Assistant Examiner—Vi Duong Dang
Attorney, Agent, or Firm—St. Onge Steward Johnston & Reens

[57] ABSTRACT

Conductive surfaces such as copper and/or tungsten surfaces, particularly copper circuitry areas of printed circuit board substrates or fused tungsten circuitry areas of fused tungsten-ceramic packages, are activated for receipt of electroless nickel plating thereon by providing the surfaces with particulate zinc metal, particularly by contact of the surfaces with an aqueous suspension of particulate zinc metal.

18 Claims, No Drawings

ELECTROLESS PLATING OF NICKEL ONTO SURFACES SUCH AS COPPER OR FUSED TUNGSTON

This is a continuation of copending application Ser. No. 07/520,635, filed on May 8, 1990, now abandoned.

BACKGROUND OF THE INVENTION

The present invention relates to electroless nickel plating, more particularly to the electroless nickel plating of surfaces such as copper or fused tungsten, and still more particularly to the activation of, e.g., copper or fused tungsten surfaces for receipt of electroless nickel.

In many applications of the fabrication of printed circuits having conductive copper circuitry paths and areas, as well as in applications of fused tungsten circuitry on ceramic substrates, electroless nickel is desired to be plated over the copper or over the fused tungsten. In printed circuits, for example, electroless nickel plating over copper is often used to form a diffusion barrier for a subsequently-applied gold plating, while in tungsten circuitry electroless nickel plating is used, e.g., to provide more readily solderable surfaces.

A wide variety of electroless nickel plating baths are available, comprised generally of aqueous solutions containing a source of nickel ions, a reducing agent for the nickel and a complexing agent, capable of operating over predetermined ranges of pH, with the most common such baths being based upon hypophosphite reducing agents. In order to electrolessly plate nickel from such baths onto copper surfaces (e.g., in printed circuit boards), it is necessary to first activate the copper surfaces. The most common means for effecting this activation is by contact of the copper surfaces with species catalytic to deposition, typically colloidal sols or solutions of palladium-tin (see, e.g., the one-step catalyst compositions of U.S. Pat. Nos. 3,011,920 and 3,532,518, requiring an acceleration step, and the one-step catalyst compositions of U.S. Pat. No. 4,863,758, which do not require acceleration). This same method is used to activate tungsten circuitry surfaces for subsequent electroless nickel plating.

For copper surfaces, it is also known to activate them by application of a prestrike layer of nickel from an electroless bath utilizing a boron compound, e.g., dimethyl amine borane or borohydride, as the reducing agent, which prestrike layer then serves to catalyze electroless nickel deposition from a more conventional bath (e.g., hypophosphite-reduced).

The palladium-based activators for electroless nickel plating of copper or fused tungsten surfaces are relatively expensive and must be maintained at carefully controlled concentrations in order to be effective. More problematic is the fact that for printed circuits having copper surfaces which are to be activated for electroless plating in this manner, the procedure involves immersion of the entire circuit board, including insulating areas, into the palladium-containing sol or solution. Although post-rinsing procedures are employed, the catalytic species may nevertheless become entrapped into insulating areas, and will there catalyze electroless nickel plating when the board is immersed in an electroless nickel bath. The resultant unwanted areas or paths of metal on the insulating areas can lead to undesirable cross-talk or shorting between conductive circuitry on the board. This same problem occurs with tungsten-ceramic packages, i.e., the palladium-based activator can become entrapped or adhered to insulating ceramic surfaces and promote undesired metallization thereof.

The same problem occurs with the prestrike method of activation for copper surfaces, i.e., the very activity of the borane or borohydride-reduced electroless nickel bath which enables it to deposit a strike layer of nickel over the copper also can result in undesired deposition of nickel on insulating areas of the board. Also in common with the palladium-based activators, these nickel strike baths are relatively expensive and their composition must be carefully controlled to avoid spontaneous plating of all metal in the solution.

SUMMARY OF THE INVENTION

It is the primary object of the present invention to provide a process for depositing an electroless nickel layer onto copper or fused tungsten surfaces, particularly on copper or fused tungsten circuitry in printed circuit boards and integrated circuits.

Another object of the invention is to effect the electroless nickel plating of copper or fused tungsten surfaces without need for expensive activators for the surfaces and in a manner which minimizes and/or eliminates deposition of nickel on surfaces which are to remain non-metallized.

Yet another object of the invention is to provide a process for activating copper or fused tungsten surfaces to prepare them for adherent receipt of electroless nickel.

These and other objects are achieved by means of a process in which the copper or fused tungsten surfaces to be electrolessly nickel plated are contacted with a composition comprised of particulate zinc metal suspended in a liquid carrier, so as to activate the surfaces to the electroless nickel deposition. Activation is achieved without need for palladium-based catalysts or nickel prestrike from solutions using boron-based reducing agents.

Among the significant advantages of the invention is the ability to activate copper or fused tungsten surfaces for subsequent electroless nickel deposition utilizing relatively low cost compositions which do not require the attention to controlled concentrations of components as is the case for palladium-based activators and boron-based prestrike activators.

Another significant advantage of the invention is that the activating composition and process are such that the activation is selective to the copper or fused tungsten surfaces relative to insulating areas where no electroless nickel deposition is required. In the process of the invention, the work object (e.g., a printed circuit board having a predetermined copper circuitry pattern and insulating substrate areas, or a tungsten-ceramic package having a defined pattern of tungsten circuitry on a ceramic substrate) is immersed in the zinc particle suspension for a time sufficient to permit zinc particles to become entrapped or attached to the copper surfaces, and in this immersion zinc particles also will likely become entrapped or attached to insulating areas of the board or package. When the board or package is then immersed in a conventional acid or alkaline electroless nickel plating bath, the zinc particles dissolve in the bath and, during the dissolution, a cathodic current is produced in reference to the copper or tungsten surface, resulting in deposition of nickel on the copper or tungsten areas. Once nickel has been deposited in this manner, electroless deposition of nickel from the bath continues thereon, essentially being autocatalyzed by the nickel seed produced by the zinc dissolution effect. At the same time, the zinc particles present on insulating surfaces undergo the same dissolution in the electroless nickel bath, but the dissolution is unaccompanied by cathodic current since no copper or tungsten is there present. Hence, no nickel deposition will occur, and any zinc particles on insulating areas will simply dissolve in the bath.

DETAILED DESCRIPTION OF THE INVENTION

The fundamental objective of the inventive process, as applied to its preferred aspects, is to deposit (e.g., entrap, attach, etc.) particulate zinc metal onto copper or tungsten surfaces so as to activate those surfaces to subsequent electroless nickel depositing. In the most preferred embodiment of the invention, this objective is attained by contact of those surfaces with a composition comprised of particulate zinc metal suspended in a carrier liquid, the contact being for a period of time effective to entrap or attach a sufficient quantity of zinc particles from the suspension onto the copper or tungsten surfaces.

For compatibility with overall processing steps and the subsequent electroless nickel baths, the carrier liquid of choice for the particulate zinc almost invariably will be water. In its simplest form of execution, the activating composition will consist of particulate zinc metal in water, and immersion therein of the surfaces to be activated will generally be accompanied by agitation or mixing of the composition to maintain the zinc particles in a generally uniform suspension in the water so as to avoid settling of the zinc particles and to achieve relatively uniform contact of the surfaces in question with zinc particles.

Typically, the particulate zinc metal in the activating composition will have a particle size on the order of less than about 50 microns, more preferably an average particle size of from about 1 to about 20 microns, and most preferably a particle size in the range of from about 5 to 7 microns.

The concentration of particulate zinc in the composition can vary within relatively wide limits, depending for example on the extent of copper or tungsten surface to be activated. Generally speaking, activation can be accomplished using as little as 0.1 grams per liter particulate zinc in the composition, but more practical compositions generally will contain at least about 1 g/l particulate zinc, and most preferably at least about 3 g/l particulate zinc. Upper limits are generally dictated by practical considerations, e.g., the ability to maintain a particular concentration of zinc particles in generally uniform suspension for use. Typically speaking, practical upper limits are on the order of 50 g/l, more preferably on the order of 30 g/l. Particularly useful ranges for the concentration of particulate zinc in the activating composition will be about 3 to about 10 grams per liter.

The basic components of the composition, i.e., particulate zinc metal and liquid carrier (water), also can be advantageously supplemented with additional components. Thus, for example, a source of alkalinity can be included in the composition, for example, as by alkali or alkaline earth metal or ammonium hydroxides, carbonates, and the like or other suitable composition-compatible compounds, in order to minimize corrosive attack on the zinc particles in the composition. Typically, the source of alkalinity is such as to achieve a composition pH of at least about 8, and preferably between about 8 and 11, and the compounds used to this end typically will be present in the composition at a concentration of from about 0.1 to about 2 g/l, more preferably from about 0.1 to about 1 g/l.

The composition also can utilize to advantage components which aid in maintaining an aqueous suspension of the zinc particles. Such components broadly include surfactants (wetting agents) and/or thickening agents (e.g., gelatin, hydrophilic colloids, and the like, as well as certain wetting agents). The presence of these components typically will be at relatively low concentrations effective to bring about the desired result of promoting and maintaining uniform suspension of zinc particles in the composition, and will, of course, vary depending upon the particular type of component used. Obviously, these components are utilized at concentrations below those which would increase the composition viscosity so substantially as to render the composition unusable in an immersion process, but apart from that criterion the range of concentration is quite broad and easily ascertainable for particular components, concentration of zinc particles in the composition, and other like factors. As to the surfactants, generally any cationic, anionic or nonionic surfactant can be employed, including for example fluorocarbon surfactants (FC 98 anionic, FC 99 anionic, FC 170C nonionic, available from 3M Corporation), sulfonic acid and/or sulfonate surfactants (Daxad 11 anionic, available from W. R. Grace & Co.; Cetats cationic, available from Hexcel), phosphate surfactants (Triton H-66 anionic, available from Rohm & Haas; Jordaphos JB-40 anionic, available from Jordan Chemical Co.), and nonionic ethoxylated alcohols and fatty acids (Triton X-100, Rohm & Haas; ENC 5540, Chemax).

Any component added to the fundamental components for the composition must, of course, be compatible with (i.e., not interfere with) the fundamental functionality of the zinc particles in activating the copper or tungsten surfaces for electroless nickel deposition. Such interference can come about, for example, where the surfactant contains compounds which exert strong surface passivating effects, as is the case, for example, with iodides or iodates which are found in certain otherwise suitable surfactants.

In terms of the process of the invention, the contact of the copper or tungsten surfaces with the activating composition (e.g., by immersion of the printed circuit board or fused tungsten-ceramic package into the composition) is preferably carried out at a composition temperature of about room temperature, although higher and lower temperatures can of course be employed. The contact time is merely that sufficient to entrap or attach a sufficient quantity of zinc particles to the surfaces to be activated so as to enable the surfaces to receive a nickel coating from an electroless nickel bath, and can vary widely depending upon the concentration of zinc particles in the composition, the extent of the areas to be activated, and the like. Typically, contact times on the order of as little as thirty seconds will be sufficient for most applications, while two minutes contact time is a more preferred and practical period.

After contact with the composition, the surfaces contacted typically should be water rinsed to remove residual wetting or thickening agents, etc. which might have been employed in the composition, as well as zinc particles which have not adhered to the surfaces. Thereafter, the electroless nickel plating is carried out in conventional manner for the period necessary to deposit the desired thickness of electroless nickel.

The invention in its preferred environment is broadly applicable to any situation where it is desired to electrolessly nickel plate copper or tungsten, but as previously noted finds its most practical applicability in the electroless nickel plating of all or predetermined areas of conductive copper circuitry on printed circuit boards and/or all or predetermined areas of fused tungsten circuitry in fused tungsten-ceramic components.

Although described herein with reference to the preferred copper or tungsten surfaces which represent immediately practical applications of the invention, the broad process per se has applicability to the electroless nickel plating of any conductive surface which is amenable to the cathodic current generating mechanism associated with dissolution of zinc particles in the electroless nickel bath at those surfaces, and more particular applicability to situations where the conductive surfaces to be electrolessly nickel plated are on a substrate having exposed non-conductive areas on which nickel deposition is not required. For example, the invention has applicability to providing an electroless nickel layer on silver and carbon conductive inks used on ceramic hybrid circuits.

Also, while the invention has been described with reference to, and is best practiced with, zinc particles, possibility also exists for use of particulate magnesium metal in the same way, either alone or in combination with zinc metal particles, and according to the teachings herein regarding zinc particulates. Magnesium is less preferred than zinc for use herein primarily because, over prolonged use, it likely will result in destabilizing of the electroless nickel bath.

The following examples are provided in further illustration of the invention.

EXAMPLE I

A fused tungsten-ceramic micro-chip holder was immersed in a stirred, room temperature aqueous suspension containing 10 gl zinc particles (average particle size of 5 to 7 microns) and 40 g/l caustic for two minutes. Thereafter, the ceramic package was rinsed thoroughly in water, and then immersed in an acidic electroless nickel bath for twenty minutes. All tungsten circuitry was coated with nickel, and no extraneous nickel was observed on the non-tungsten areas of the ceramic insulator.

EXAMPLE II

A printed circuit board having defined areas of copper traces was cleaned, deoxidized and rinsed, and then immersed in the zinc particle suspension of Example I such that only half the board was immersed in contact with the suspension. After thirty seconds, the entire board was water rinsed and immersed in an acidic electroless nickel bath. After five minutes, all copper traces on the board half previously immersed in the zinc suspension were coated with nickel, while the copper traces on the other board half had no nickel deposit. No nickel was observed on any of the insulating areas of the board, including those on the board half previously immersed in the zinc suspension.

EXAMPLE III

A copper foil-clad printed circuit board substrate with through holes was treated to provide electroless copper in the through holes and over the copper foil, and was thereafter provided with a patterned resist by use of a layer of photoresist, imagewise exposure, and development. The resist-patterned board was then processed to provide electroplated copper and electroplated tin-lead layers on the non-resist surfaces, followed by stripping of the resist, etching of the previously resist-covered areas down to the insulating substrate, stripping of the previously-applied tin-lead layer, and application of solder mask over preselected areas of the circuitry. Thereafter, in order to activate the exposed copper traces and copper coated through-holes for subsequent electroless nickel plating, the board was immersed in a room temperature, stirred aqueous suspension containing 40 g/l zinc particles, 40 g/l sodium hydroxide, and 5 g/l alkyl naphthalene sulfonic acid (Daxad 11 anionic surfactant) for two minutes. The board was then water rinsed and immersed in an acidic electroless nickel plating bath whereupon the activated copper surfaces, but no other areas, received a coating of electroless nickel. The board was then rinsed, the nickel-plated areas provided with an electroless gold plate, rinsed and dried.

The foregoing is, of course, just one of many possible sequences in the fabrication of printed circuit boards, and the present invention is applicable to any fabrication method wherein electroless nickel is required to be plated onto selected copper areas.

The foregoing description and examples are provided in illustration of particular features and embodiments of the invention, and are not intended to limit the scope of the invention except as set forth in the appended claims.

What is claimed is:

1. A process for selectively providing an electroless plating comprised of nickel over a conductive surface area of a substrate containing both a conductive surface area and a non-conductive surface area, said process consisting essentially of:
   (a) providing a substrate containing both a conductive surface area and non-conductive surface area;
   (b) non-selectively contacting said conductive surface area and said non-conductive surface area of said substrate with a composition comprising particulate zinc metal suspended in a carrier liquid, whereby said particulate zinc metal is thereby caused to be present on said conductive surface area and said non-conductive surface area of said substrate; and
   (c) non-selectively contacting said conductive surface area and said non-conductive surface area of said substrate, having said particulate zinc metal thereon, with an electroless nickel plating bath, whereby electroless deposition of a plating comprised of nickel selectively occurs over said conductive surface area of said substrate and not over said non-conductive area of said substrate.

2. A process according to claim 1 wherein said non-selective contacting of said conductive surface area and said non-conductive surface area of said substrate with said composition comprising particulate zinc metal in a carrier liquid, comprises immersion of said substrate in said composition.

3. A process according to claim 2 wherein said non-selective contacting of said conductive surface area and non-conductive surface area of said substrate with said electroless nickel plating bath comprises immersion of said substrate in said plating bath.

4. A process according to claim 1 wherein said conductive surface area of said substrate comprises copper.

5. A process according to claim 1 wherein said conductive surface area of said substrate comprises tungsten.

6. A process according to claim 1 wherein said substrate comprises a printed circuit board and wherein said conductive surface area of said substrate comprises copper circuitry of said printed circuit board.

7. A process according to claim 1 wherein said substrate comprises a ceramic, and wherein said conducive surface area of said substrate comprises fused tungsten circuitry on said substrate.

8. A process according to claim 2 wherein said composition comprising particulate zinc metal into which said substrate is immersed is agitated to maintain zinc particles in suspension during said immersion.

9. A process according to claim 1 wherein said carrier liquid is water.

10. A process according to claim 9 wherein said composition comprising particulate zinc further comprises a source of alkalinity sufficient to achieve a composition pH of at least about 8.

11. A process according to claim 9 wherein said composition comprising particulate zinc further comprises an agent, selected from the group consisting of wetting agents, thickeners and mixtures thereof, for promoting and maintaining said zinc particles in suspension in said composition.

12. A process according to claim 10 wherein said composition comprising particulate zinc further comprises an agent, selected from the group consisting of wetting agents, thickeners and mixtures thereof, for promoting and maintaining said zinc particles in suspension in said composition.

13. A process according to claim 9 wherein the concentration of zinc particles in said composition is at least about 0.1 g/l.

14. A process according to claim 13 wherein the concentration of zinc particles in said composition is from about 1 to about 50 g/l.

15. A process according to claim 14 wherein the concentration of zinc particles in said composition is from about 3 to about 10 g/l.

16. A process according to claim 9 wherein said zinc particles have an average particle size of from about 1 to about 20 microns.

17. A process for selectively providing an electroless plating comprised of nickel over a conductive surface area of a substrate containing both a conductive surface area and a non-conductive surface area, said process consisting essentially of:
 (a) providing a substrate containing both a conductive surface area and a non-conductive surface area;
 (b) immersing said substrate in a composition comprising particulate zinc metal suspended in a carrier liquid, whereby said particulate zinc metal is thereby caused to be present on said conductive surface area and said non-conductive surface area of said substrate; and
 (c) immersing said substrate, having said particulate zinc metal on said conductive surface area and said non-conductive surface area thereof, in an electroless nickel plating bath, whereby electroless deposition of a plating comprised of nickel occurs over said conductive surface area of said substrate and not over said non-conductive surface area of said substrate.

18. A process for selectively providing an electroless plating comprised of nickel over conductive surface areas, selected from the group consisting of copper and tungsten, which are present on a substrate also containing non-conductive surface areas, said process consisting essentially of:
 (a) providing a substrate containing both non-conductive surface areas and conductive surface areas selected from the group consisting of copper and tungsten;
 (b) non-selectively contacting said non-conductive surface areas and said conductive surface areas of copper or tungsten, with a composition comprising particulate zinc material suspended in a carrier liquid, whereby said particulate zinc metal is thereby caused to be present on said non-conductive surface areas and said conductive surface areas of copper or tungsten; and
 (c) non-selectively contacting said non-conductive surface areas and said conductive surface areas of copper or tungsten, having said particulate zinc thereon, with an electroless nickel plating bath, whereby electroless deposition of a plating comprised of nickel selectively occurs on said copper or tungsten surfaces of said substrate and not on said non-conductive surfaces of said substrate.

* * * * *